United States Patent
Moroni et al.

(10) Patent No.: US 6,800,901 B2
(45) Date of Patent: Oct. 5, 2004

(54) PROCESS FOR THE SELECTIVE FORMATION OF SALICIDE ON ACTIVE AREAS OF MOS DEVICES

(75) Inventors: Maurizio Moroni, Rho (IT); Cesare Clementi, Busto Arsizio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/274,314

(22) Filed: Oct. 17, 2002

(65) Prior Publication Data
US 2003/0111689 A1 Jun. 19, 2003

Related U.S. Application Data

(62) Division of application No. 09/076,613, filed on May 12, 1998, now Pat. No. 6,492,234.

(51) Int. Cl.[7] .......................... H01L 21/44; H01L 29/76
(52) U.S. Cl. ........................ 257/336; 257/328; 257/335; 438/664; 438/665; 438/305; 438/306
(58) Field of Search ................................ 257/335, 336, 257/326, 334, 413, 384, 406; 438/664, 665, 305, 306

(56) References Cited

U.S. PATENT DOCUMENTS

| | | | |
|---|---|---|---|
| 4,735,680 A | 4/1988 | Yen | 156/643 |
| 4,855,247 A | 8/1989 | Ma et al. | 437/44 |
| 4,949,136 A * | 8/1990 | Jain | 257/344 |
| 4,988,643 A | 1/1991 | Tsou | 437/200 |
| 5,086,017 A | 2/1992 | Lu | 437/200 |
| 5,120,673 A | 6/1992 | Itoh | 437/44 |
| 5,200,351 A | 4/1993 | Hadjizadeh-Amini | 437/44 |
| 5,283,449 A | 2/1994 | Ooka | 257/204 |
| 5,328,863 A | 7/1994 | Cappelletti et al. | 437/52 |
| 5,389,809 A | 2/1995 | Haken et al. | 257/344 |
| 5,439,839 A | 8/1995 | Jang | 437/44 |
| 5,508,217 A | 4/1996 | Sawada | 437/40 |
| 5,521,411 A | 5/1996 | Chen et al. | 257/344 |
| 5,550,073 A | 8/1996 | Hong | 437/43 |
| 5,589,423 A | 12/1996 | White et al. | 437/228 |
| 5,605,854 A | 2/1997 | Yoo | 437/44 |
| 5,658,811 A * | 8/1997 | Kimura et al. | 438/289 |
| 5,753,557 A * | 5/1998 | Tseng | 438/303 |
| 5,759,897 A | 6/1998 | Kadosh et al. | 438/286 |
| 5,759,901 A * | 6/1998 | Loh et al. | 438/305 |
| 5,763,285 A | 6/1998 | Yang | 437/44 |
| 5,930,631 A | 7/1999 | Wang et al. | 438/286 |
| 5,933,740 A | 8/1999 | Chapman | 438/303 |

FOREIGN PATENT DOCUMENTS

| | | |
|---|---|---|
| EP | 0 334 761 A1 | 9/1989 |
| EP | 0 607 820 A2 | 7/1994 |
| JP | 07-233042 | 3/1997 |

OTHER PUBLICATIONS

Pfiester et al., "A Cobalt Salicide CMOS Process with TiN–Strapped Polysilicon Gates," *IEEE Electron Device Letters*, 12(6): 350–352, 1991.

* cited by examiner

Primary Examiner—Nathan J. Flynn
Assistant Examiner—Fazli Erdem
(74) Attorney, Agent, or Firm—Lisa K. Jorgenson; E. Russell Tarleton; Seed IP Law Group PLLC

(57) ABSTRACT

Process for forming salicide on active areas of MOS transistors, each MOS transistor comprising a gate and respective source and drain regions, the source and drain regions each comprising a first lightly doped sub-region adjacent the gate and a second highly doped sub-region spaced apart from the gate. The salicide is formed selectively at least over the second highly doped sub-regions of the source and drain regions of the MOS transistors, and not over the first lightly doped sub-region.

12 Claims, 5 Drawing Sheets

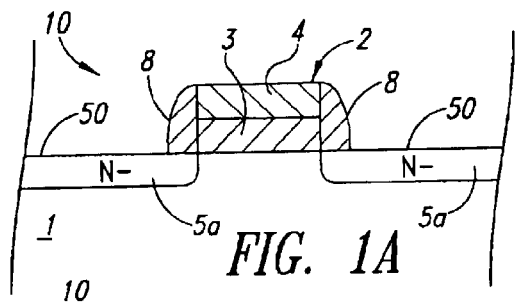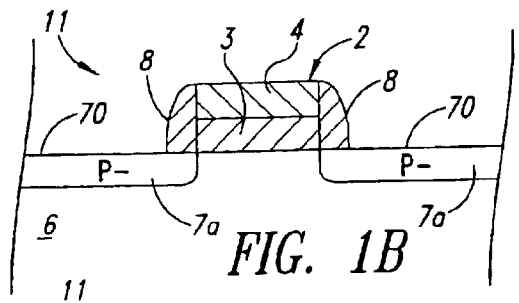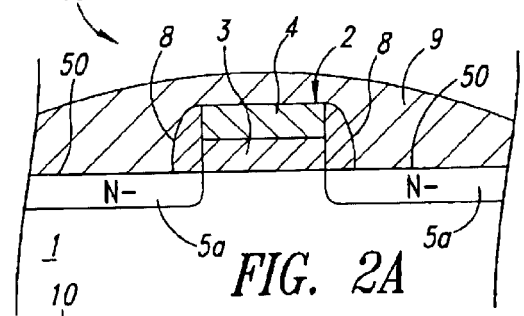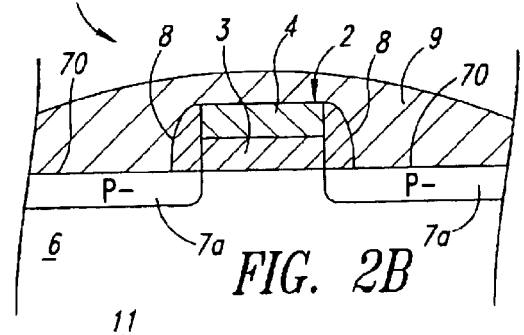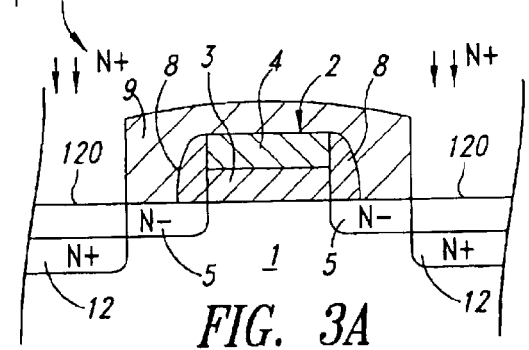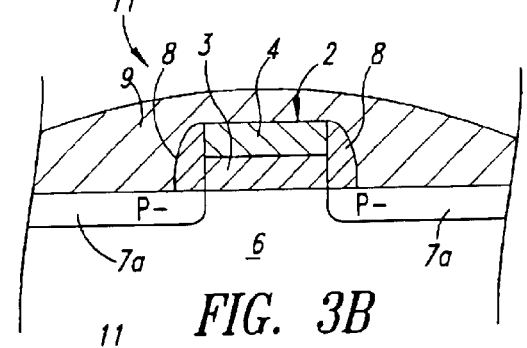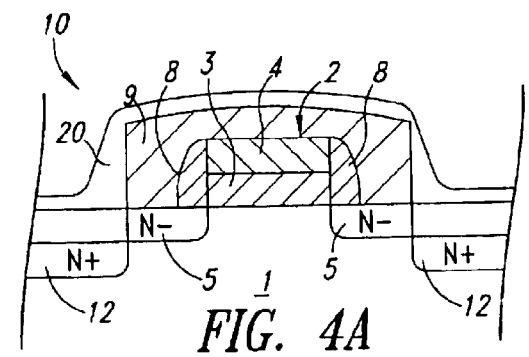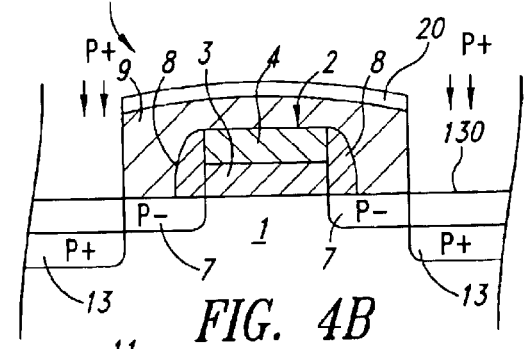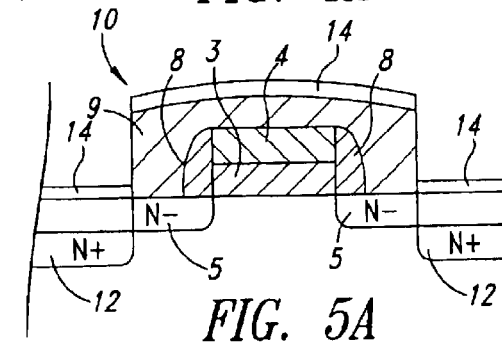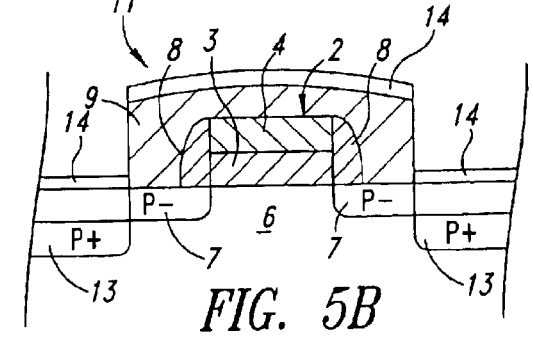

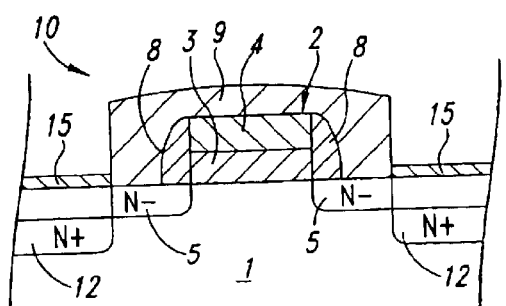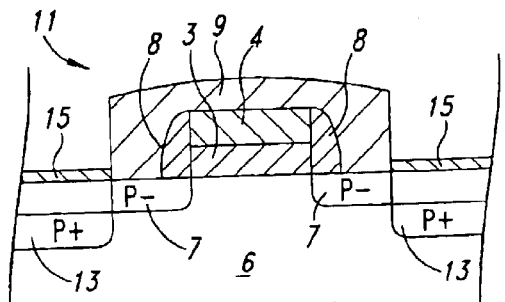
FIG. 6A    FIG. 6B
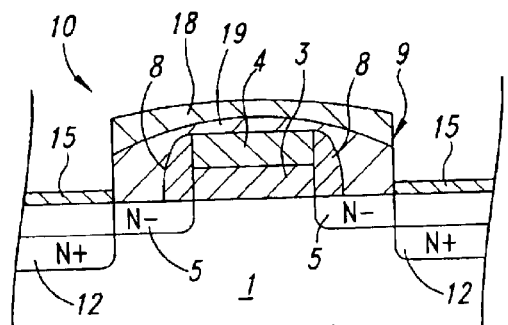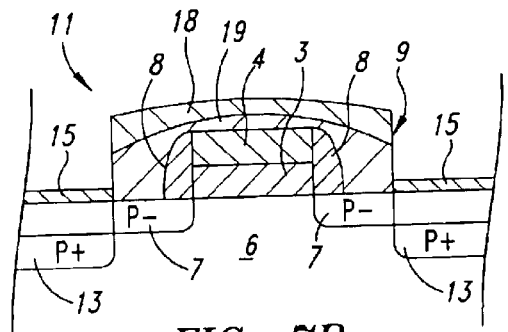
FIG. 7A    FIG. 7B
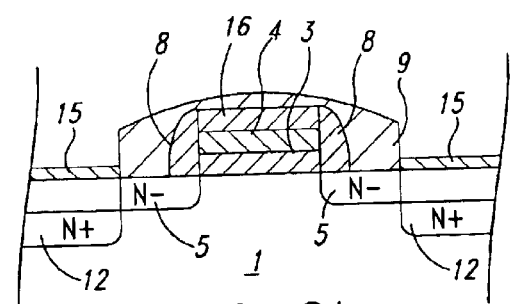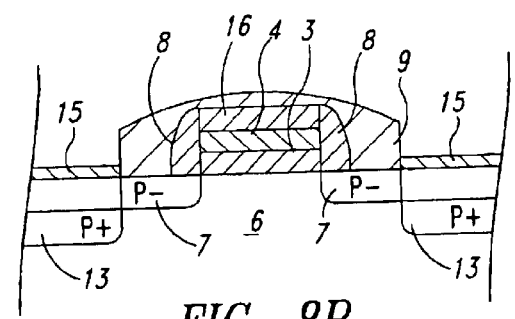
FIG. 8A    FIG. 8B
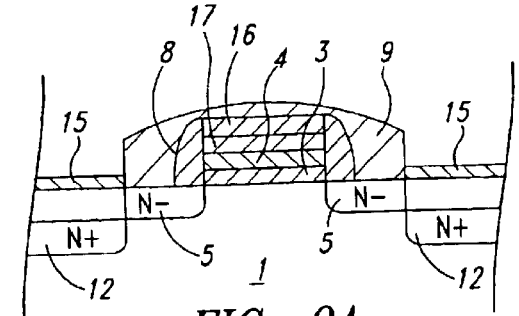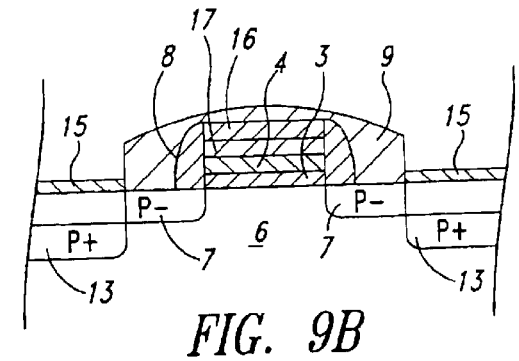
FIG. 9A    FIG. 9B

PROCESS FOR THE SELECTIVE FORMATION OF SALICIDE ON ACTIVE AREAS OF MOS DEVICES

CROSS-REFERENCE TO RELATED APPLICATION

This application is a Divisional of U.S. patent application Ser. No. 09/076,613, filed May 12, 1998 now U.S Pat. No. 6,492,234 and allowed Jul. 17, 2002.

TECHNICAL FIELD

The present invention relates to a process for the selective formation of salicide on active areas of MOS devices.

BACKGROUND OF THE INVENTION

In the field of semiconductor integrated circuits, it is known to use composite materials comprising silicon and a transition metal e.g., Ti, Co and the like, called silicides, for forming layers having a relatively small resistivity.

In particular, silicides are formed on active areas of MOS transistors for reducing the resistance of source and drain diffusion regions, when these regions extend significantly.

A known method for forming a silicide layer on the active areas of MOS transistors provides for forming a gate of the transistor, comprising a gate oxide layer and a polysilicon layer, introducing in the silicon a dopant for the formation of the source and drain diffusion regions of the transistors, and then depositing, over the whole surface of the silicon, a transition metal, such as Ti and Co, and performing a thermal process during which the transition metal reacts with the silicon for creating the silicide.

Since the silicide layer which forms on the active area of the MOS transistor is automatically aligned with the gate, the process is called "self-aligned-salicidation", shortly "salicidation", and the layer thus obtained is correspondingly called "salicide".

A drawback in the formation of salicide is due to the consumption of part of the silicon at the interface during the reaction between silicon and the transition metal.

In addition, during the salicidation process part of the dopant in the underlying silicon is absorbed.

For normal MOS transistors these effects are not particularly harmful, thanks to the substantial depth of the source and drain diffusion regions and their high doping level.

However, in some applications such as those providing for forming, by means of the "Drain-Extension" (DE) technique, N- or P-channel MOS transistors for high voltage (HV), the source and drain diffusion regions of the MOS transistors, respectively, comprise a first region, lightly doped and shallow, and a second region, more heavily doped and of greater thickness, connected to the first region. For the fabrication of such transistors, after the formation of the gate a relatively small dose of dopant is introduced in the silicon, respectively of N type for the N-channel transistors and of P-type for the P-channel ones, so as to form said first lightly doped regions of the source and drain diffusion regions which are automatically aligned with the gate. Successively, a high dose of dopant, of N or P type, is selectively implanted by way of a mask covering the gate and extending over the first lightly doped regions.

In order to form salicide over the source and drain diffusion regions of the transistors, a transition metal is then deposited over the whole silicon surface, and there is performed a thermal process.

The salicide thus forms both over the more heavily doped and deeper regions of the source and drain diffusion regions, where as already mentioned it does not cause particular problems, and over the more lightly doped and shallower regions of the source and drain diffusion regions.

In such lightly doped regions, due to their low doping level and their small thickness, the absorption of dopant by the salicide and the consumption of part of the silicon for the formation of salicide can cause problems, for example, the short-circuit of the salicide with the substrate.

SUMMARY OF THE INVENTION

An object of the present invention is that of providing a process of formation of salicide over active areas of MOS transistors, particularly of the type formed by means of the "drain-Extension" technique, allowing one to overcome the above-mentioned problems, in particular avoiding deterioration of existing lightly doped regions of the source and drain diffusions regions.

In an embodiment of the present invention, there is provided a process for forming salicide on active areas of MOS transistors, each comprising a gate and respective source and drain regions comprising each a first lightly doped sub-region near the gate and a second highly doped sub-region spaced apart from the gate, wherein the salicide is formed selectively only over said second highly doped sub-regions of the source and drain regions of the MOS transistors.

The salicide is formed by depositing over the whole surface of a semiconductor wafer a layer of a transition metal, but protecting (masking) those regions of the wafer where the salicide is not to be formed, in particular the first sub-regions of the source and drain regions of the MOS transistors, in such a way as the transition metal is in contact with the silicon over said second sub-regions but not over the first sub-regions. By submitting the wafer to a thermal process, the layer of transition metal reacts to form the salicide only in the regions where it is deposited directly over the silicon (mono- or poly-crystalline) while remaining unmodified in the other regions from which it can be removed.

Advantageously, for depositing the transition metal over said second sub-regions the same mask is used as that used for the selective introduction of the dopant for the formation of the second sub-regions.

These and other features and advantages of the present invention will be made apparent by the following detailed description of embodiments thereof, illustrated as non-limiting examples in the annexed drawings.

BRIEF DESCRIPTION OF THE DRAWINGS

FIGS. 1 to 6 show steps of a process according to a first embodiment of the invention both in the case of an N-channel MOSFET (FIGS. 1A–6A) and in the case of a P-channel one (FIGS. 1B–6B).

FIG. 7A shows a step of a process according to a second embodiment of the invention on an N-channel MOSFET and FIG. 7B shows the same step of a P-channel MOSFET.

FIG. 8A shows an N-channel transistor with a gate comprising three different layers to which the process of the invention has been applied and FIG. 8B shows a P-channel transistor with a gate with three layers.

FIG. 9A shows an N-channel transistor with a gate comprising four different layers to which the process of the invention has been applied and FIG. 9B shows a P-channel transistor with a similar structure.

DETAILED DESCRIPTION OF THE INVENTION

Figure 10:
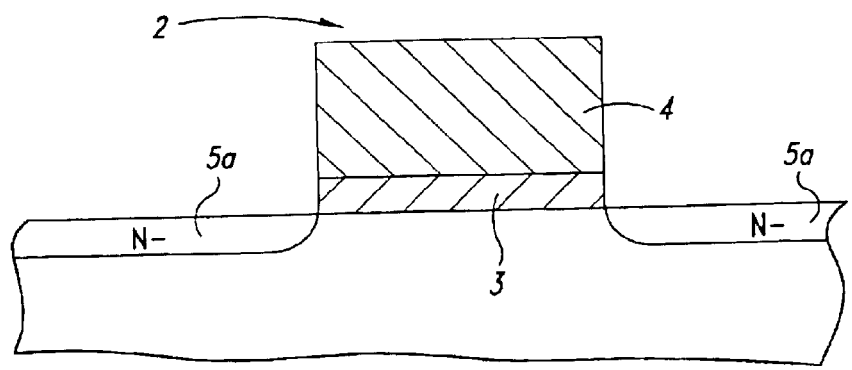
FIGS. 10 to 13 show steps of a process according to a third embodiment of the invention, applied to an N-channel MOSFET.
Figure 11:
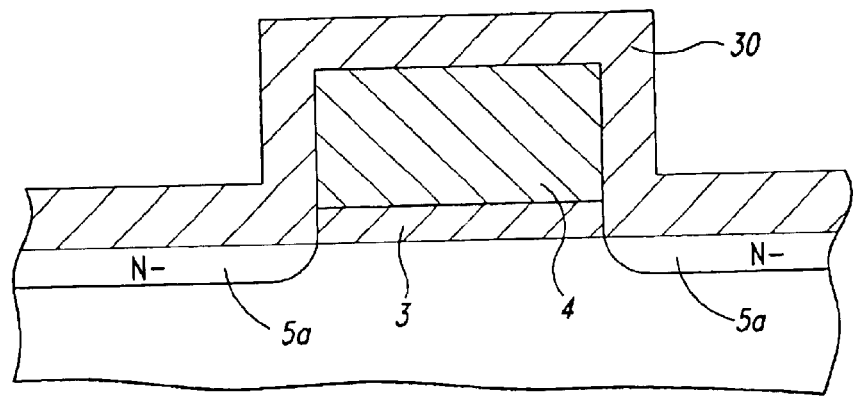

With reference to FIGS. 1A and 1B, there are shown two MOS transistors 10, 11, respectively, N-channel (FIG. 1A) and P-channel (FIG. 1B), formed according to the known technique.

For the formation of the N-channel MOS transistor 10, over a P type substrate or well 1, particularly with a dopant concentration of the order of $10^{20}$ atoms/cm$^3$, a gate 2 is formed comprising a gate oxide layer 3 and a polysilicon layer 4.

By the definition of the gate 2, there are defined two areas 50 for the formation of first lightly doped N-diffusions 5A of source and drain regions for MOS transistor 10, obtained by means of implantation and successive diffusion of N type ions in a dose of approximately $10^{12}$ atoms/cm$^2$.

For the formation of P channel MOS transistor 11 (FIG. 1B), over an N type substrate or well 6, there is formed (simultaneously with that of MOS transistor 10) a gate 2 comprising the gate oxide layer 3 and the polysilicon layer 4.

There are thus defined two areas 70 for the formation, by means of implantation of P type ions in a dose of approximately $10^{12}$ atoms/cm$^2$ and their successive diffusion, of further first lightly doped P– source and drain regions 7A.

For both the transistors 10 and 11 there are subsequently formed, by means of conventional techniques, dielectric material spacers 8 on both sides of the gate 2.

Over the whole surface of the silicon and over said transistors 10, 11, as shown in FIG. 2, there is then formed another layer of dielectric 9, such as, e.g. SiO$_2$, with a thickness ranging from 200 to 500 Angstroms.

With reference to FIG. 3, such a layer of dielectric 9, by means of a mask, is then selectively etched away so as to uncover surface portions 120 of the first source and drain regions 5A of the N-channel MOS transistor 10. Inside said surface portions 120, there are formed implantations of N type ions at high dose, approximately of $10^{15}$ atoms/cm$^2$, so to form source and drain heavily doped N+ sub-regions 12.

In this way, there are obtained source and drain regions for the N-channel transistor 10, each one formed by a first lightly doped N– sub-regions 5 and a second more heavily doped N+ sub-regions 12.

After having performed a deposition of a layer of resist 20 to protect the sub-regions 12 from successive implants, as shown in FIG. 4, there is performed a second masking and a successive etching for uncovering surface portions 130 of part of the source and drain regions 7A, where there are performed implantations of P type ions at high doping level, approximately $10^{15}$ atoms/cm$^2$, for forming heavily doped P+ sub-regions 13 of source and drain.

In this way there are obtained source and drain regions for the P-channel transistor 11, each one composed of a first lightly doped P– sub-region 7 and a second more heavily doped P+ sub-region 13.

After having removed the resist layer 20, over the whole surface a layer of a transition metal 14, for example Ti and Co, is deposited, as shown in FIG. 5, and a thermal process is then executed for the formation of a salicide layer 15. The salicide forms only where the transition metal is in contact with the silicon. Over the dielectric 9 no salicide is formed and the transition metal is then removed, as shown in FIG. 6. As appears from FIG. 6, the presence of the dielectric 9, formed to mask the lightly doped source and drain sub-regions 5 and 7 and the gates 2 of the transistors from the implantations of ions at high dose, is advantageously used to protect regions 5, 7 and the gates 2 from salicidation. Thus, the salicidation process only happens in the heavily doped sub-regions 12, 13.

According to a preferred embodiment, shown in FIG. 7, the dielectric layer 9 may comprise a double layer, a first one of SiO$_2$ 19, a second one of Si$_3$N$_4$ 18, thus avoiding the direct contact between the silicon and the nitride of said second layer 18. Also in this embodiment the overall thickness of layer 9 ranges from about 200 to about 500 Angstroms.

In an alternative embodiment, the process according to the present invention can also be applied to the salicidation of MOS transistors which, as shown in FIG. 8, have gates 2 each comprising, in addition to the gate oxide layer 3 and the polysilicon layer 4, a further dielectric layer 16 suitable, for example, for improving the lithographic definition process of the gate, so as to avoid the contact between the polysilicon layer 4 and the overlying dielectric layer 9 used for the selective implantation of the high doses of N and P type dopants.

Similarly, in another alternative embodiment, the process according to the invention can be applied to the salicidation of MOS transistors in which the gates 2, as shown in FIG. 9, in addition to the gate oxide layer 3 and the polysilicon layer 4, each also comprises a silicide layer 17 formed over the polysilicon layer 4. In this latter embodiment, since salicidation 15 cannot be performed over the silicide layer 17, each gate 2 must comprise a further dielectric layer 16 covering the silicide layer 17 where the latter is not protected by the dielectric 9.

The gate 2 is thus defined leaving on the polysilicon 4 the layer of residual dielectric 16. Once the spacers 8 have been formed, the process according to the invention is performed.

There is thus obtained a process for the selective formation of salicide wherein the salicide layer is formed only over the heavily doped N+ and P+ sub-regions of source and drain 12, 13, and not over the more lightly doped N– or P– sub-regions 5 and 7. The more heavily doped sub-regions, due to their greater thickness and their higher doping level, are much less affected than the lightly doped sub-regions by deterioration caused by consumption of silicon during the salicidation and by absorption of dopant by the salicide. Furthermore, the process described does not require additional masks, because the mask already provided for the selective implantation of the high doses of N and P type dopants are advantageously exploited.

Referring now to FIGS. 10 to 13, there are shown steps of a process according to another embodiment of the present invention, referred for simplicity to the fabrication of an N-channel MOSFET only. The extension of similar principle to a P-channel MOSFET will be straightforward for persons skilled in the art.

After having defined the insulated gate of the MOSFET, comprising the gate oxide 3 and the polysilicon layer 4, and after having formed lightly doped N-source and drain regions by means of a Lightly Doped Drain (LDD) implant (N- for the N-channel MOSFETs, P- for the P-channel MOSFETs, with a dopant dose of approximately $10^{12}$ and, respectively, $10^{13}$ atoms/cm$^2$), the structure shown in FIG. 10 is obtained.

A CVD (Chemical Vapor Deposited) dielectric layer 30 is then deposited over the surface. The dielectric layer 30 can be, for example, an oxide layer formed by TEOS or a layer of nitride, and has preferably a thickness of 150 to 300 nanometers.

A photoresist mask layer 31 is then formed over the structure. A selective etching of the dielectric layer 30 is then performed; where the mask layer 31 is present, the dielectric layer 30 is not removed. As visible from FIG. 12, the mask layer 31 leaves an N- drain sub-region 5A of the MOSFET covered. At the source side, instead, where the mask layer 31 is not present, during the etching process an insulating sidewall spacer 32 is formed.

By means of the same mask layer 31 and the spacer 32, a selective implantation of a high dose of dopants (e.g., $10^{15}$ atoms/cm$^2$) is then performed, so as to form heavily doped N+ source and drain portions 5B. It is to be noted that this selective implant step could as well be performed by using a different mask formed over the structure after the removal of the photoresist layer 31.

Figure 13:
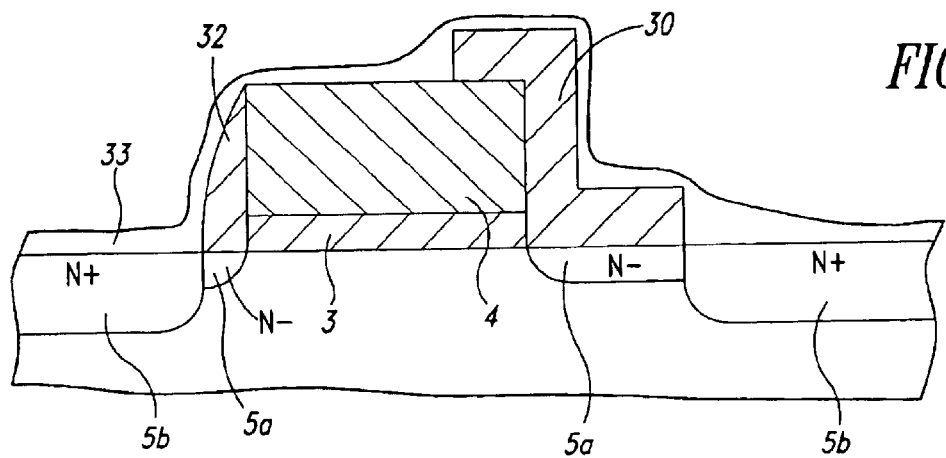

Then after the removal of the mask layer 31, as shown in FIG. 13, a layer of a transition metal 33 is deposited over the whole surface. A thermal process is then performed so as to form, where the transition metal layer is in direct contact with silicon or with polysilicon, a salicide layer, as in the first embodiment previously described.

It is to be noted that, thanks to this embodiment of the invention, the dimension of the N-region 5A at the drain side can be varied as desired.

Figure 14:
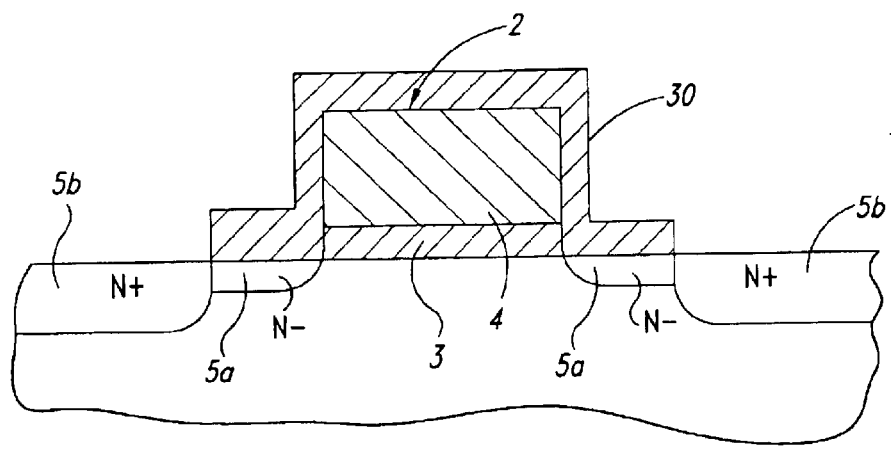
FIG. 14 shows an alternative of the process of FIGS. 10 to 13.

In an alternative embodiment shown in FIG. 14, the dielectric layer 30 is left over the whole polysilicon gate 4 of the MOSFET, and also covers the N-source sub-region 5A. Thus, the salicide layer will only be formed over the heavily doped portions 5B of the source and drain regions of the MOSFET.

Evidently, the polysilicon layer 4 of the MOSFETs can comprise a layer of polycide, such as for example $Wsi_2$.

Figure 15:
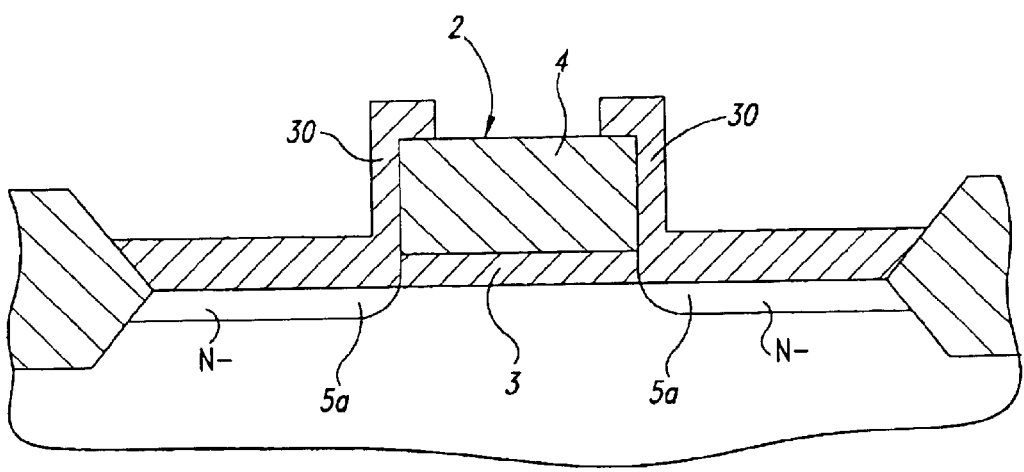
FIG. 15 shows the use of the process of FIGS. 10 to 13 for the formation of salicide only over the gate of an N-channel MOSFET having lightly doped source and drain regions.

The process of FIGS. 10 to 13 also allows for preventing the formation of salicide over the source and drain regions of MOSFETs that do not comprise heavily doped source and drain region portions, as shown in FIG. 15. The dielectric layer 30 can cover completely the polysilicon layer 4 or, as shown in FIG. 15, the polysilicon layer 4 can be left exposed so that a salicide layer is formed over the polysilicon layer 4.

Figure 16:
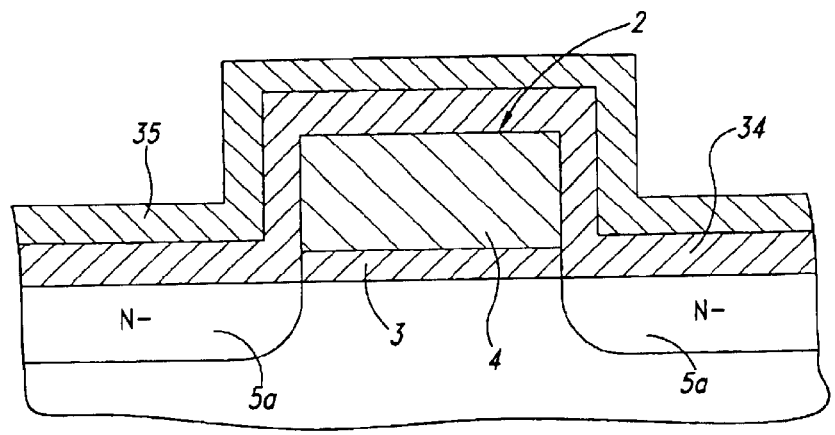
FIGS. 16 to 18 show steps of a process according to a fourth embodiment of the present invention.
Figure 17:
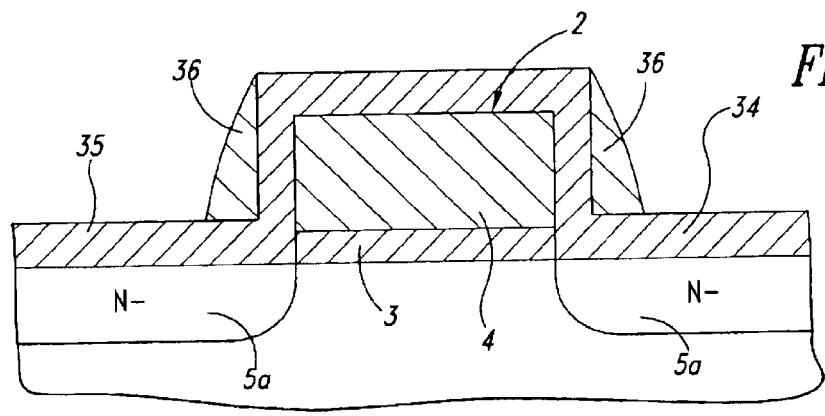
Figure 18:
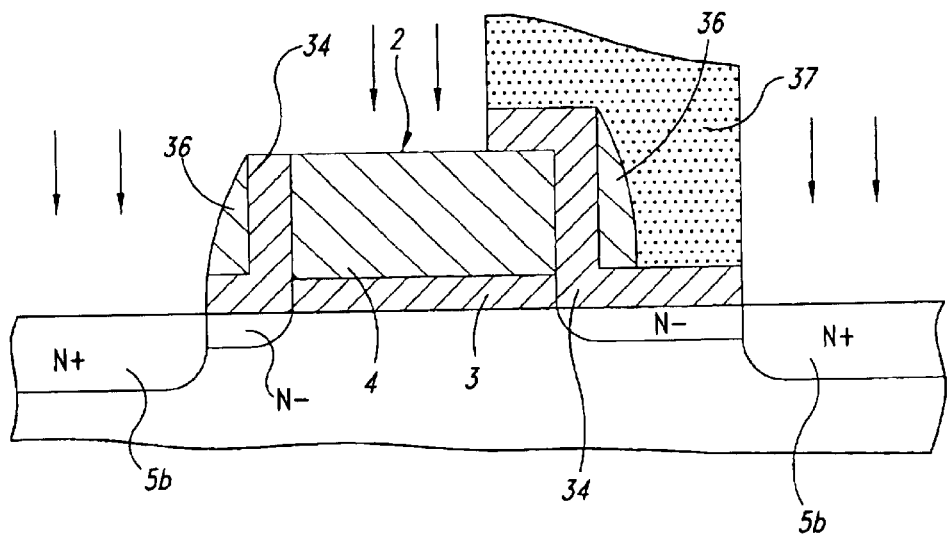

Another alternative embodiment of the invention is shown in FIGS. 16 to 18. In this embodiment, starting from the structure shown in FIG. 10, two dielectric films 34, 35 are deposited sequentially, where the two films preferably have different etching rates.

Then, without using any mask, the upper film 35 is etched. The etching process is stopped when the surface of the lower dielectric film 34 is reached. This can be advantageously achieved if the two films 34, 35 have different etching rates. In this way, as shown in FIG. 17, dielectric sidewall spacers 36 are formed.

Then a photoresist mask layer 37 is formed over a portion of the N-drain region of the MOSFET, and the lower dielectric film 34 is etched down to the silicon surface where the dielectric film 34 is not covered by either the mask layer 37 or the spacer 36. The mask layer 37 could also not be employed, and in this case a symmetric structure would be obtained, with the N-portion 5A at the drain side having a same extension-of the N- portion 5A at the source side.

Figure 12:
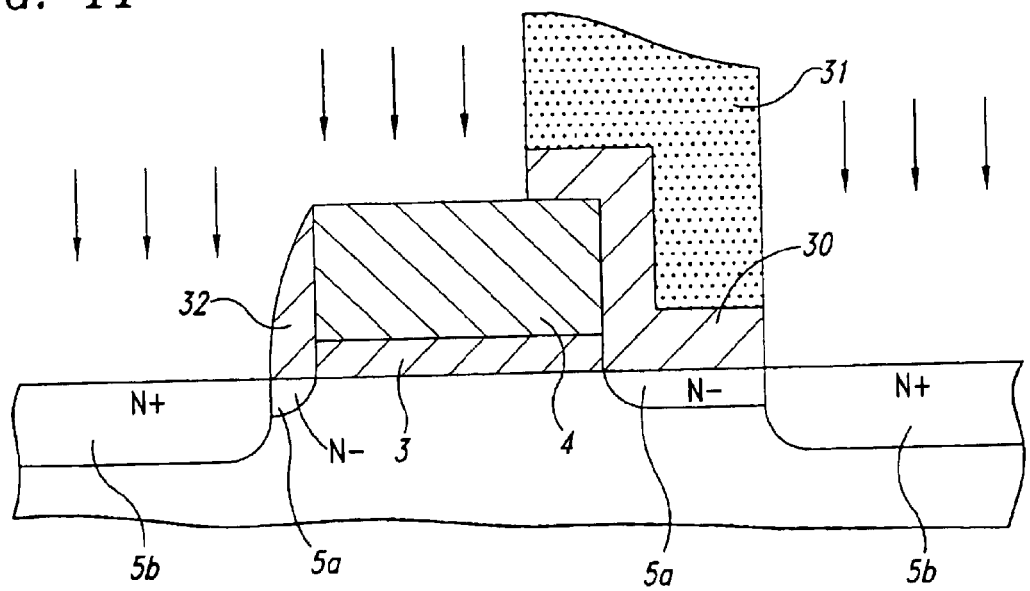

Then, a high dose of dopants (N type in the case of an N-channel MOSFET, P type in the case of a P-channel one) is implanted as in FIG. 12, so as to obtain the structure shown in FIG. 18.

It should also be noted that the upper film 35 may not necessarily be a dielectric film. It could as well be a conductive layer, which can be selectively removed after the etching processes before or after the ion implantation steps.

Even if the invention has been described in connection with normal N-channel and P-channel MOS transistors, it is apparent that the invention can be similarly applied also in the case of said MOS transistors with "stacked gate" type used for example to form non-volatile memory cells.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A semiconductor device having a gate, a source and a drain region wherein the source and drain regions respectively comprises lightly-doped sub-regions adjacent to the gate and highly-doped sub-regions spaced apart from the gate, said highly-doped sub-regions covered by salicide and said lightly-doped sub-regions covered by a protective layer, said lightly-doped sub-regions each having different dimensions.

2. The device of claim 1 wherein the salicide are formed by a layer of transition metal including titanium or cobalt.

3. The device of claim 1 Wherein said protective layer has an upper and a lower layer having different etching rates with a total thickness of about 150 to about 500 Angstrom.

4. The device of claim 1, further comprising a mask layer covering at least the lightly-doped sub-region of the drain region or a sidewall spacer covering at least the lightly doped sub-region of the source region.

5. A MOS transistor having a gate with at least one adjacent spacer and respective source and drain regions, the source and drain regions each having a first lightly-doped sub-region adjacent to the gate and second highly-doped sub-region of the source and drain regions formed adjacent the first lightly-doped sub-regions, and a salicide layer formed in automatic alignment over the second highly-doped sub-regions and not over the first lightly-doped sub-regions by a layer of transition metal, in particular one of either Ti or Co over the second sub-regions and not over the first sub-regions of the source and drain regions that is reacted with the underlying silicon material by means of a thermal process.

6. The device of claim 5, wherein the lightly-doped sub-regions are formed to each have different dimensions.

7. A MOS transistor comprising a gate having at least one adjacent spacer, a source region, and a drain region;
    a lightly-doped sub-region formed in the source region and a lightly-doped sub-region formed in the drain region;
    a highly-doped sub-region formed in the source region adjacent the lightly-doped sub-region, and a highly-doped sub-region formed in the drain region adjacent the lightly-doped sub-region; and salicide formed in automatic alignment over the highly-doped sub-regions but not over the lightly-doped sub-regions of the respective source and drain regions.

8. The transistor of claim 7, wherein the lightly-doped sub-regions in the source region and the drain regions are formed to each have different dimensions.

9. A semiconductor device having a gate, a source region, and a drain region, the device comprising:

a spacer formed adjacent at least one side of the gate;

lightly-doped sub-regions formed in the source region and the drain region, respectively, adjacent the gate; and highly-doped sub-regions spaced apart from the gate and positioned adjacent the lightly-doped sub-regions, the highly-doped sub-regions covered with salicide that does not cover the lightly-doped sub-regions.

10. The device of claim 9, wherein the lightly-doped sub-regions are covered by a protective layer.

11. The device of claim 9, wherein the salicide is formed by a layer of transition metal formed from one of titanium and cobalt.

12. The device of claim 9, wherein the protective layer has an upper and a lower layer having different etching rates with a total thickness of about 150 to about 500 angstrom.

* * * * *

UNITED STATES PATENT AND TRADEMARK OFFICE
CERTIFICATE OF CORRECTION

PATENT NO. : 6,800,901 B2  Page 1 of 1
DATED : October 5, 2004
INVENTOR(S) : Maurizio Moroni et al.

It is certified that error appears in the above-identified patent and that said Letters Patent is hereby corrected as shown below:

<u>Title page,</u>
Item [30], Foreign Application Priority Data, should read:
-- May 13, 1997 (EP) ………………….. 907830219.8 --.

Signed and Sealed this

Second Day of May, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,800,901 B2 | Page 1 of 1 |
| APPLICATION NO. | : 10/274314 | |
| DATED | : October 5, 2004 | |
| INVENTOR(S) | : Maurizio Moroni et al. | |

It is certified that error appears in the above-identified patent and that said Letters Patent is hereby corrected as shown below:

<u>Title page,</u>
Item [30], Foreign Application Priority Data, should read:
-- May 13, 1997 (EP) ………………….. 97830219.8 --.

This certificate supersedes Certificate of Correction issued May 2, 2006

Signed and Sealed this

Fifth Day of September, 2006

JON W. DUDAS
*Director of the United States Patent and Trademark Office*